United States Patent [19]

Hong

[11] Patent Number: 5,576,232

[45] Date of Patent: Nov. 19, 1996

[54] FABRICATION PROCESS FOR FLASH MEMORY IN WHICH CHANNEL LENGTHS ARE CONTROLLED

[75] Inventor: Gary Hong, Hsin-chu, Taiwan

[73] Assignee: United Microelectronics Corp., Hsinchu, Taiwan

[21] Appl. No.: 353,673

[22] Filed: Dec. 12, 1994

[51] Int. Cl.$^6$ .............................................. H01L 21/8247
[52] U.S. Cl. ................................................ 437/43; 437/44
[58] Field of Search .................................. 437/52, 48, 44, 437/43

[56] References Cited

U.S. PATENT DOCUMENTS

| 5,021,848 | 6/1991 | Chin ............................................. 437/43 |
| 5,293,328 | 3/1994 | Amin et al. ............................... 365/185 |

*Primary Examiner*—H. Jey Tsai
*Attorney, Agent, or Firm*—Ladas & Parry

[57] ABSTRACT

A process for fabricating memory cells for split-gate flash memory devices is disclosed to feature self-alignment and therefore precisely defined channel lengths for the floating-gate and isolation transistors of the memory cell. A gate oxide layer, a first conducting layer, and a gate dielectric layer are formed in sequence on a semiconductor substrate. A conducting strip is formed on the gate dielectric layer. The conducting strip is covered with a shielding layer. The gate dielectric layer, the first conducting layer and the gate oxide layer are etched utilizing the shielding layer as a shielding mask to form a control gate for the memory cell. Thermal oxidation is applied to the entire substrate utilizing the shielding layer as a shielding mask to form a tunnel oxide layer on the surface of the substrate and isolating oxide layers on the sidewalls of the control gate. The shielding layer is removed. Electrically conducting sidewall spacers are formed on both of the sidewalls of the conducting strip. Each of the conducting sidewall spacers cover a portion of the tunnel oxide layer and are also electrically isolated from the control gate by the isolating oxide layer, forming the floating gate for the memory cell. Impurities are implanted utilizing the conducting strip and the conducting sidewall spacers as shielding masks to form source and drain regions on the substrate for the memory cell.

7 Claims, 8 Drawing Sheets

FABRICATION PROCESS FOR FLASH MEMORY IN WHICH CHANNEL LENGTHS ARE CONTROLLED

BACKGROUND OF THE INVENTION

1. Filed of the Invention

The present invention relates in general to semiconductor memory device fabrication processes. In particular, the present invention relates to the process for fabrication of high reliability flash memory devices. More particularly, the present invention relates to a process for fabrication of split-gate flash memory devices featuring self-alignment for improved endurance and reliability.

2. Technical Background

Conventional semiconductor fabrication processes for manufacturing split-gate flash memory devices employ photolithography techniques for defining channel dimensions of the transistors in memory cells of flash memory arrays. Since it is difficult to achieve an acceptable level of precision in photomasking alignments in the process of photolithography, fabricated split-gate memory devices can exhibit problematic operational characteristics.

Figure 1:
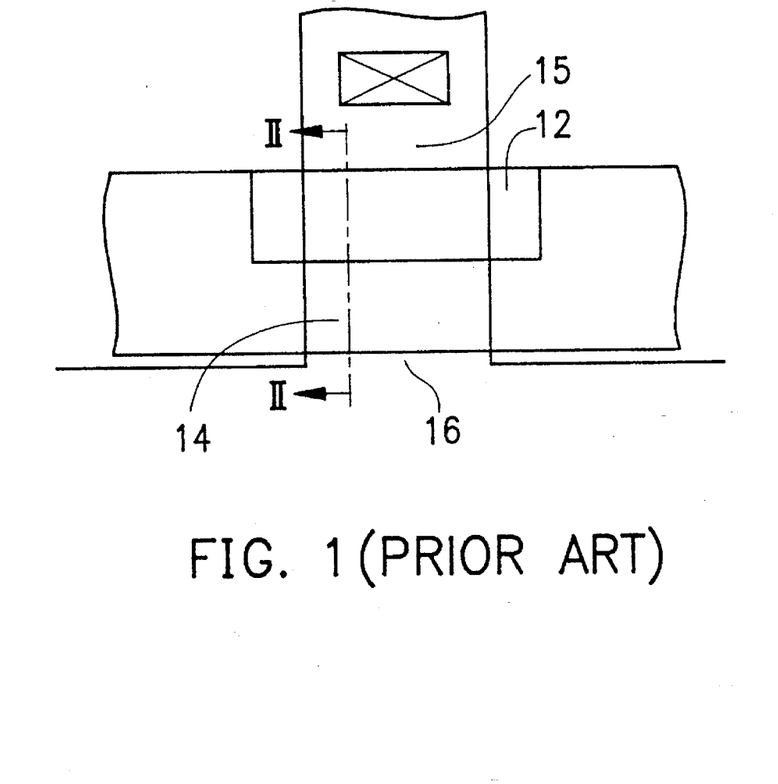
FIG. 1 schematically shows in plan view a conventional split-gate flash memory device fabricated on a semiconductor substrate.
Figure 2:
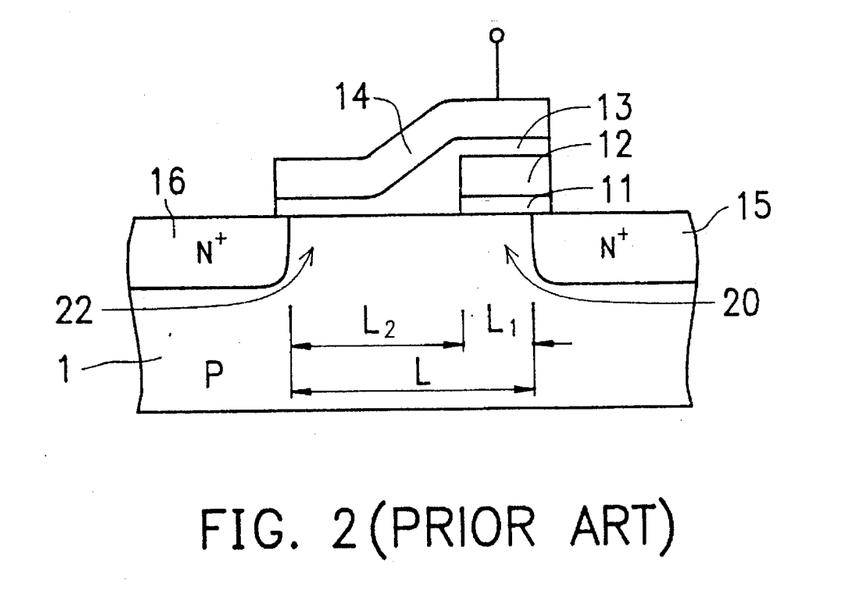
FIG. 2 shows in cross-sectional view taken along the II—II line the conventional flash memory device of FIG. 1.
Figure 3:
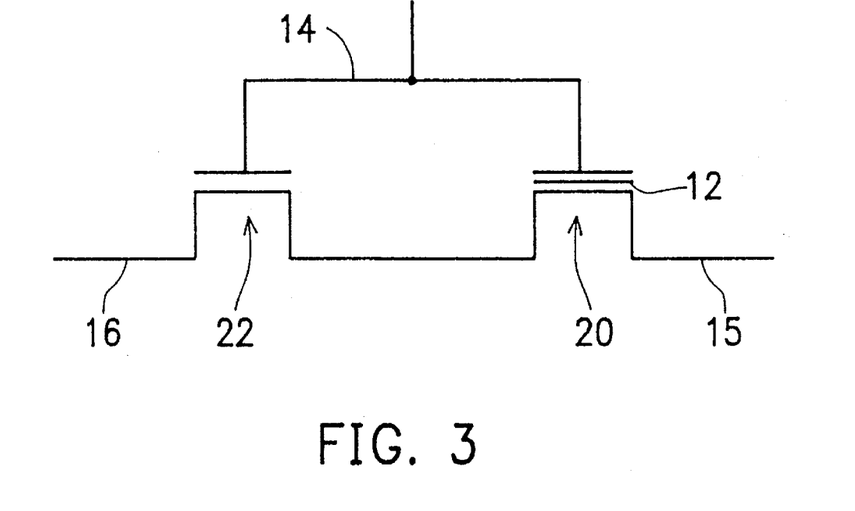
FIG. 3 shows the schematic diagram of an equivalent circuit of the typical flash memory device of FIGS. 1 and 2.

For example, refer to the configuration of one typical prior art split-gate flash memory device as shown in FIGS. 1, 2 and 3. FIG. 1 shows a schematic plan view of the device. FIG. 2 shows a cross section of the FIG. 1 device taken along selected section II—II. FIG. 3 depicts and equivalent circuit schematic. As seen in FIG. 2, the memory cell of the typical split-gate flash memory device usually combines a floating-gate transistor 20 and an enhanced isolation transistor 22 on a P-type substrate 1. The memory cell includes floating gate 12, control gate 14, drain region 15, source region 16, layer of tunnel oxide 11, and gate dielectric 13. As is seen in FIG. 2, channel length L of the entire split-gate memory cell is generally equal to channel length $L_1$ of floating-gate transistor 20 and channel length $L_2$ of isolation transistor 22.

The memory cell having a structural configuration combining a floating-gate transistor and an enhanced isolation transistor features an important advantage in its inherent characteristics. During the process of memory erasure, however, to ensure complete removal of the electrons previously injected into the floating gate, the erasure operation is normally sustained for a slightly prolonged time period. There are occasions when such a prolonged erasure operation results in the removal of excess electrons, i.e., more electrons than were previously injected. This results in the formation of electron holes in the floating gate of the device. In severe cases, the floating-gate transistor becomes a depletion transistor, which conducts even in the absence of applying a high voltage at control gate 12. This phenomena is known in the art as memory over-erasure. Isolation transistor 22 in such a split-gate memory cell will keep in the OFF state even if floating gate transistor 20 is subjected to over-erasure and brought into the ON state. This isolation characteristic provided by isolation transistor 22 is important for the correct operation of the memory cell.

However, as indicated above, due to difficulties in achieving an acceptable level of alignment precision during the photolithographic fabrication process of such a split-gate memory cell, it is not easy to confine the dimensions of $L_1$ and $L_2$, i.e., the channel lengths of floating gate and isolation transistors 20 and 22 respectively, to within specified tolerances even when total channel length L of the memory cell is set to a fixed value. A mis-aligned distribution of channel lengths among the floating gate and isolation transistors would cause the memory cell to function unreliably. For example, if channel length $L_2$ for isolation transistor 22 is insufficient, the desired isolation effect would not be obtained.

Figure 4:
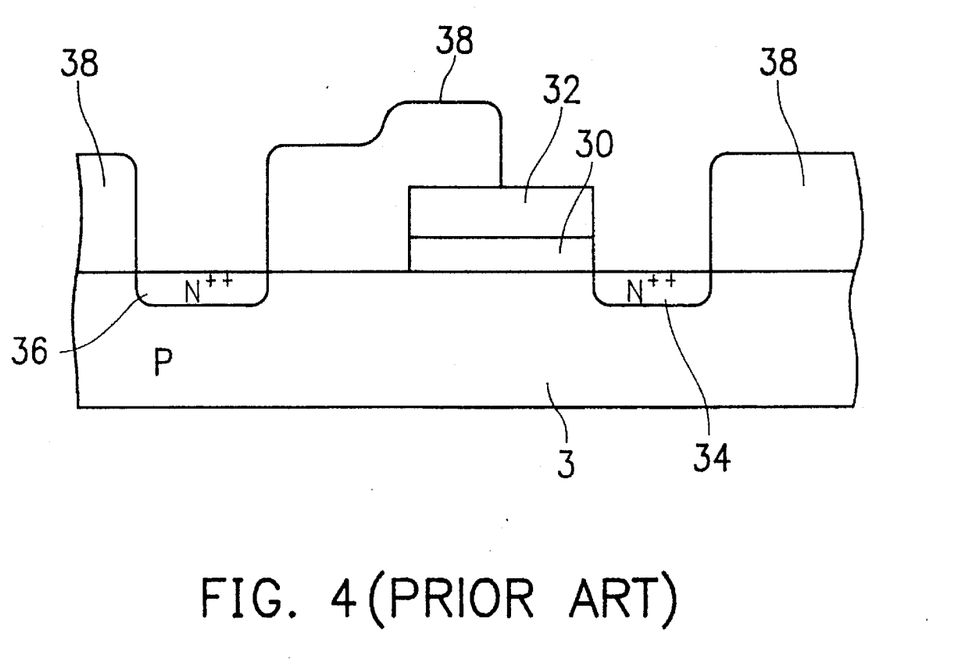
FIG. 4 shows in cross-sectional view another prior art flash memory device.

FIG. 4 shows the cross-sectional view of a split-gate memory cell fabricated in accordance with the teaching of the U.S. Pat. No. 4,868,629, issued on Sep. 19, 1989 to B. Eitan, entitled "Self-Aligned Split Gate EPROM." The memory cell is fabricated on P-type substrate 3 and includes floating gate 32, drain region 34, source region 36, and layer of tunnel oxide 30. Photoresist layer 38 is employed for alignment in defining the channels of the floating-gate and isolation transistors in the memory cell. The photomasking alignment difficulty will therefore apply to such a fabrication methodology. Since achieving acceptable dimensions in the channel lengths of the floating-gate and isolation transistors by this process is difficult, correct operation of the fabricated memory devices might be not obtained.

Figure 5:
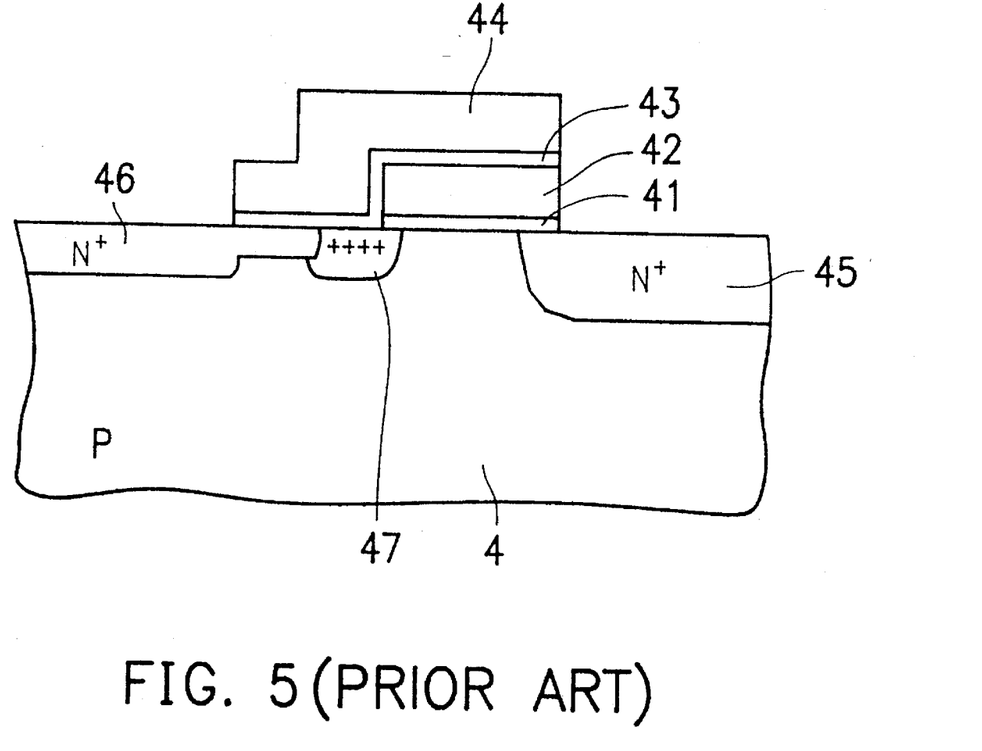
FIG. 5 shows in cross-sectional view yet another prior art flash memory device.

FIG. 5 shows the cross-sectional view of a split-gate memory cell fabricated in accordance with the teaching of U.S. Pat. No. 4,949,140, issued on Aug. 14, 1990 to S. M. Tam, entitled "EPROM Cell With Integral Select Transistor." The memory cell is fabricated on P-type substrate 4 and includes floating gate 42, control gate 44, source region 45, drain region 46, P-type implanted region 47, layer of tunnel oxide 41, and gate dielectric 43. In accordance with the disclosure, sidewall spacers are employed for defining the channel length of the isolation transistor, while the entire channel length of the memory cell, as well as the channel length of the floating-gate transistor included therein, is defined by the photolithography procedure. Therefore, this memory device may also suffer the problem of unreliable operation due to insufficient precision in the channel lengths.

Moreover, since these prior art memory cells all implement a memory cell erasure and writing operation from either source or drain side, such single-sided erasure and writing operation reduces the life expectancy and reliability of the device. This reduction is due to the fact that the floating gate 20 of this split-gate memory cell configuration is only provided near drain region 15, which results in different mechanisms occurring for the programming and erasing operations of the device. The resulting reduction of allowable program/erase cycles renders the device suitable only for those applications requiring a relatively few number of program/erase cycles during the entire life span of the device.

SUMMARY OF THE INVENTION

It is therefore an object of the present invention to provide a fabrication process for manufacturing memory cells for flash memory devices having precisely defined dimensions in the channel lengths of the constituent transistors for improved device reliability.

It is another object of the present invention to provide a fabrication process for manufacturing memory cells for flash memory devices allowing dual-side erasure and writing of data for improved endurance.

The present invention achieves the above indicated objects by providing a process for fabricating memory cells for split-gate flash memory devices featuring self-alignment, and, therefore, precisely defined channel lengths for the floating and isolating transistors of the memory cell. A gate oxide layer, a first conducting layer, and a gate dielectric layer are formed in sequence on a semiconductor substrate. A conducting strip is formed on the gate dielectric layer. The conducting strip is covered with a shielding layer. The gate dielectric layer, the first conducting layer and the gate oxide layer are etched utilizing the shielding layer as a shielding mask to form a control gate for the memory cell. Thermal oxidation is applied to the entire substrate utilizing the shielding layer as a shielding mask to form a tunnel oxide layer on the surface of the substrate and isolating oxide layers on the sidewalls of the control gate. The shielding layer is removed. Electrically conducting sidewall spacers are formed on both of the sidewalls of the conducting strip. Each of the conducting sidewall spacers cover a portion of the tunnel oxide layer and are also electrically isolated from the control gate by the isolating oxide layer, forming the floating gate for the memory cell. Impurities are implanted utilizing the conducting strip and the conducting sidewall spacers as shielding masks to form source and drain regions on the substrate for the memory cell.

Other objects, features and advantages of the present invention will become apparent by way of the detailed description of a preferred but non-limiting embodiment.

BRIEF DESCRIPTION OF THE DRAWINGS

The description of a preferred embodiment of the invention is made with reference to the accompanying drawings, wherein.

DETAILED DESCRIPTION OF THE PREFERRED EMBODIMENT

Figure 6:
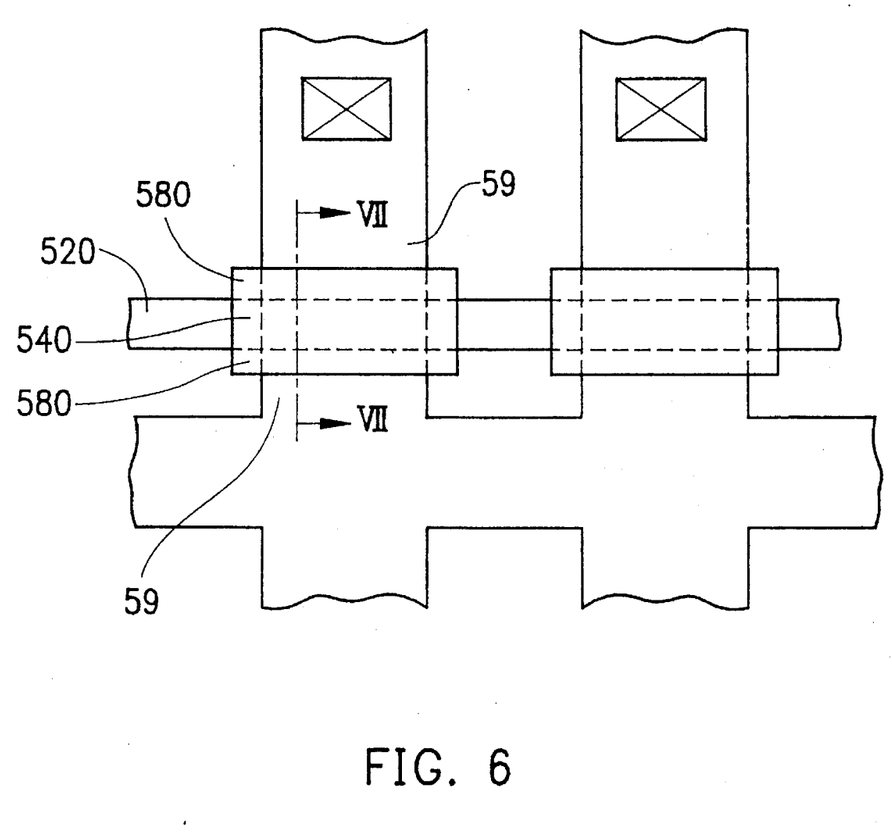
FIG. 6 schematically shows in plan view a flash memory device fabricated in accordance with a preferred embodiment of the present invention.

In FIG. 6, a pair of memory cells of the flash memory device fabricated in accordance with a preferred embodiment of the present invention is shown schematically in plan view. The process of fabricating memory cells irk the flash memory device in accordance with a preferred embodiment of the present invention is depicted in selected stages of fabrication through views of the device taken along the VII—VII section line of FIG. 6.

The fabrication process of the present invention is suitable for making split-gate memory cells of a flash memory device on a semiconductor substrate of either N- or P-type. The process of fabrication, as depicted in the selected stages outlined in FIGS. 7a–7h, referring to the plan view of FIG. 6 as needed, is described as follows:

Stage 1

Figure 7A:
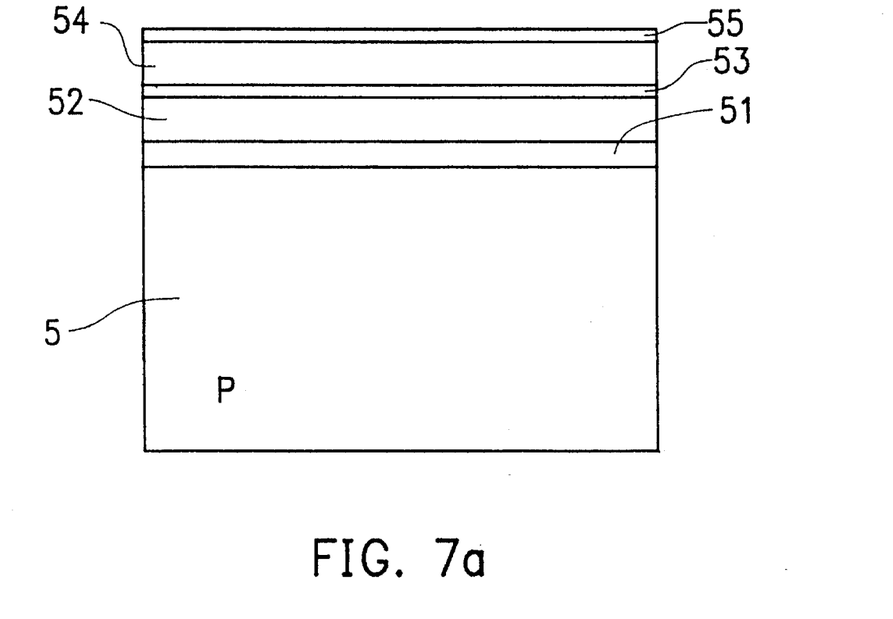
FIGS. 7a–7h shows in cross-sectional views taken along lines VII—VII of FIG. 6 a flash memory device in various stages of fabrication in accordance with a preferred embodiment of the present invention.

Referring to FIG. 7a, semiconductor substrate 5, of P-type in the example shown in FIGS. 7a–7h (but which may be appropriately implemented by those skilled in the art using N-type) is shown. On semiconductor substrate 5 is formed: layer of gate oxide 51, with a thickness of about 150–400Å; electrically conducting layer 52 by, such as, depositing polysilicon to a thickness of about 3,000Å and then implanting impurities to lower the electrical resistance therein; layer of dielectric 53 having a structural configuration of, for example, oxide-nitride-oxide (ONO); electrically conducting layer 54 by, such as depositing polysilicon to a thickness of about 2,000Å and then implanting impurities to lower the electrical resistance therein; and shielding layer 55 by, such as, depositing nitride to a thickness of about 500–1,000Å. It should be noted that the drawing in FIG. 7a is not drawn in exact scale concerning the thicknesses described above.

Stage 2

Figure 7B:
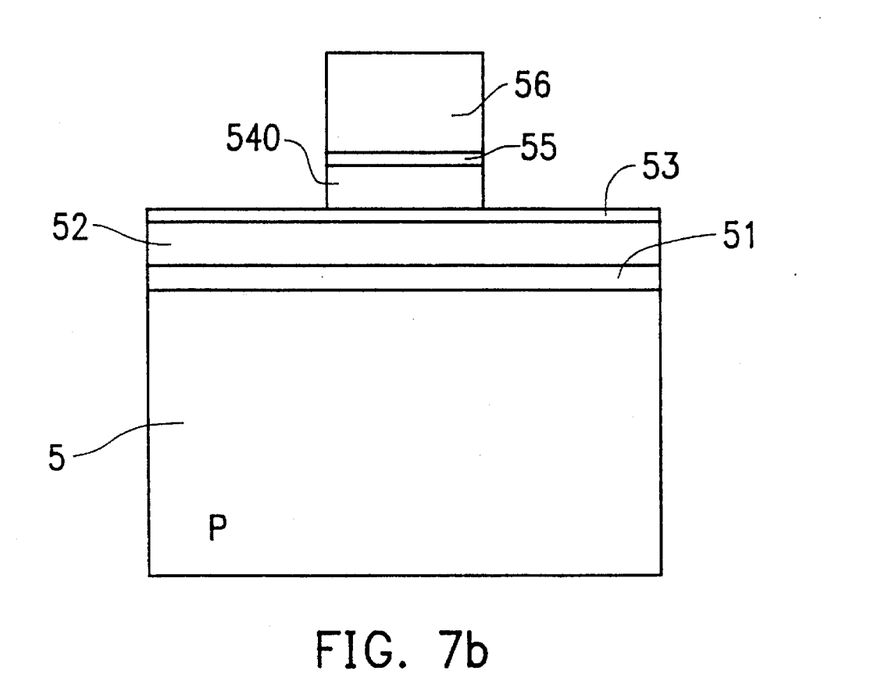

Referring next to FIG. 7b, shielding photomasking layer 56 for fabricating word lines of the mass memory array in the flash memory device is then formed by known methods in the art on the designated locations above shielding layer 54. An etching process is then conducted to etch away the exposed area of both layer 54 and shielding layer 55 not shielded by photomasking layer 56, forming in layer 54 electrically conducting strips 540 (FIG. 6), which is still covered by shielding layer 55. Word line shielding photomasking layer 56 is then removed.

Stage 3

Figure 7C:
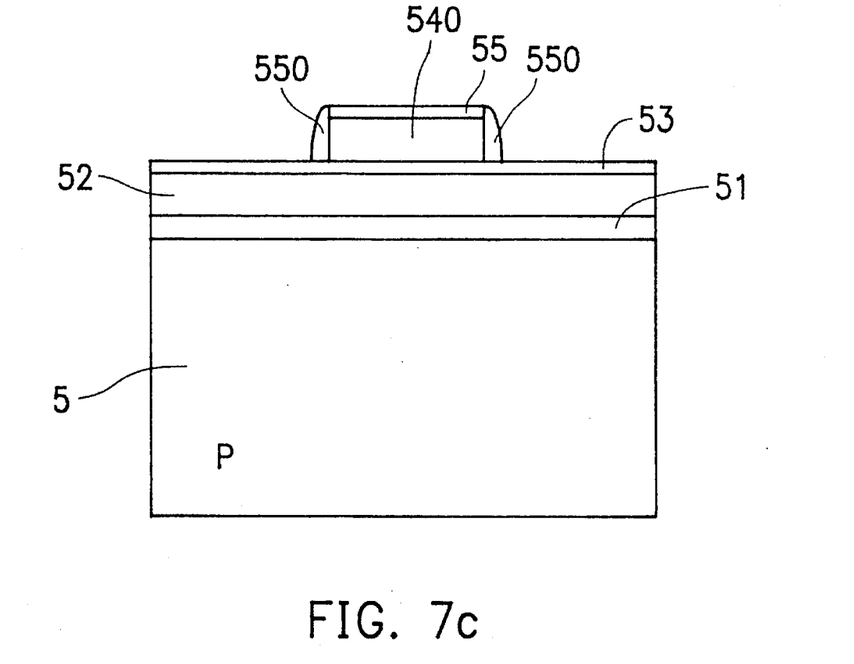

Referring next to FIG. 7c, the sidewalls of conducting strips 540 are then covered with shielding layer 550, which can be considered as the extension to shielding layer 55, and, together with shielding layer 55, is utilized for covering conducting strips 540. The forming of shielding layer 550 can, for example, be deposited on conducting strips 540 as nitride layer having a thickness of about 300Å, and then subjected to a process of, such as, plasma etching back to form the nitride spacers 550.

Stage 4

Figure 7D:
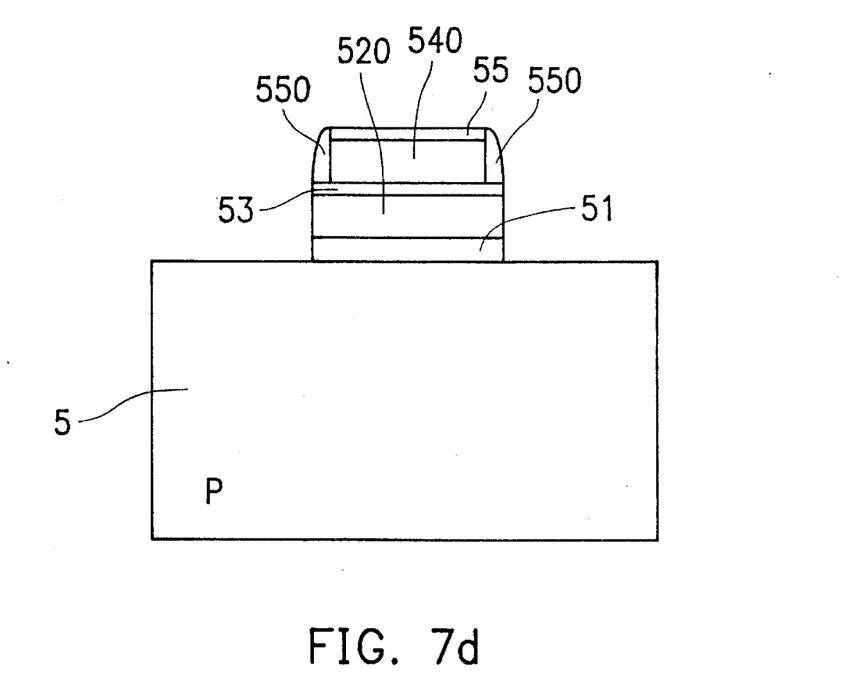

Referring next to FIG. 7d, an etching procedure is then conducted, utilizing shielding layers 55 and 550 as the shielding masks for protecting conducting strips 540, to etch away portions of gate dielectric layer 53, electrically conducting layer 52 and gate oxide layer 51 not being covered under conducting strips 540. The remaining portion of layer 52 now form control gate 520 of the memory cell.

Stage 5

Figure 7E:
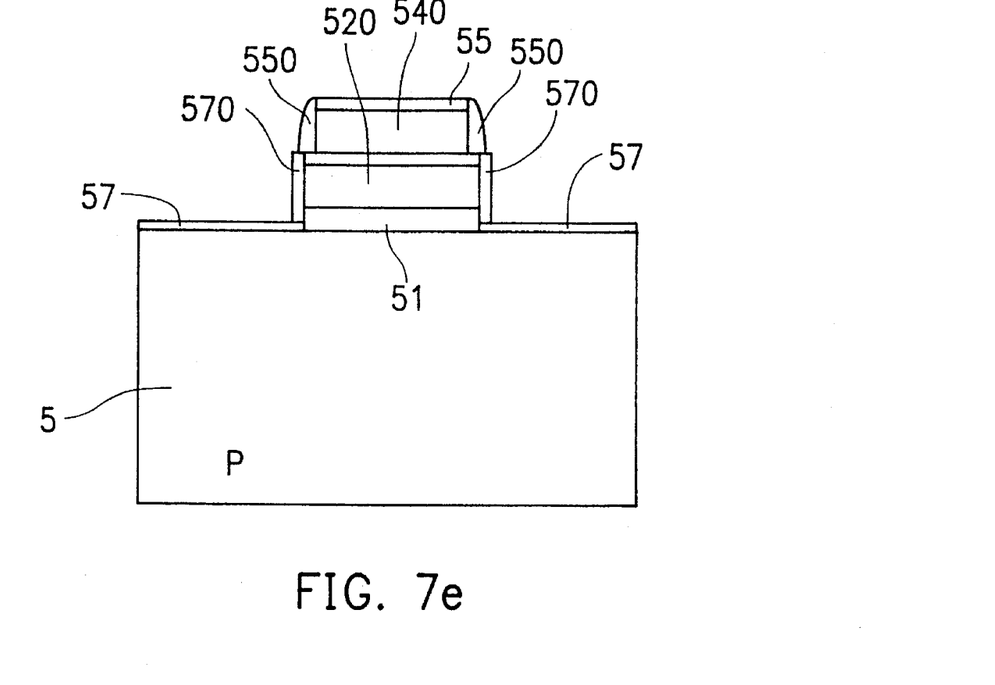

Referring next to FIG. 7e, shielding layers 55 and 550 are again utilized as the shielding masks for isolating conducting strips 540 when a thermal oxidation procedure is applied to the entire substrate. The thermal oxidation is performed in oxygen ambient and at a temperature of between 800° C. to 1100° C. This procedure results in the formation of tunnel oxide layer 57 on the top surface of substrate 5, having a thickness of about 60–100Å, which is tunnel oxide of memory cell, and also isolating oxide layer 570 on the sidewall of control gate 520, having a thickness of about 200–400Å. The reason for thicker oxide (200–400Å) of 570 than 57 grown at the same time is that the polysilicon (520) is heavily doped with impurity.

Stage 6

Figure 7F:
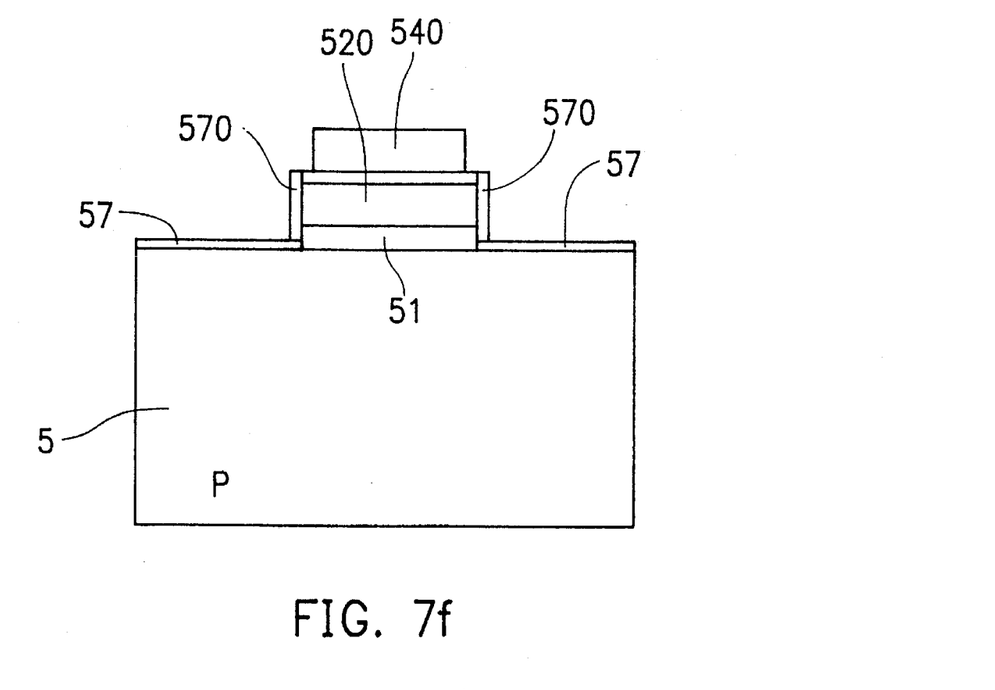

Then, as shown in FIG. 7f shielding layers 55 and 550 are removed.

Stage 7

Figure 7G:
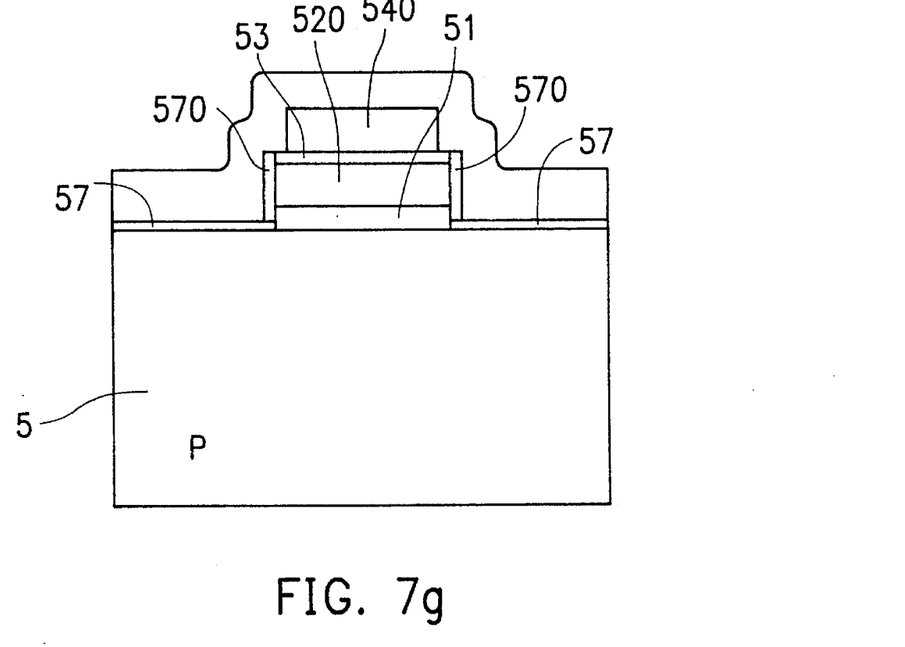

Referring to FIG. 7g, a deposition process is then conducted to deposit electrically conducting layer 58 of, for example, polysilicon having a thickness of about 2,000–6,000Å, on the entire structure fabricated on top of substrate 5 up to this stage.

Stage 8

Figure 7H:
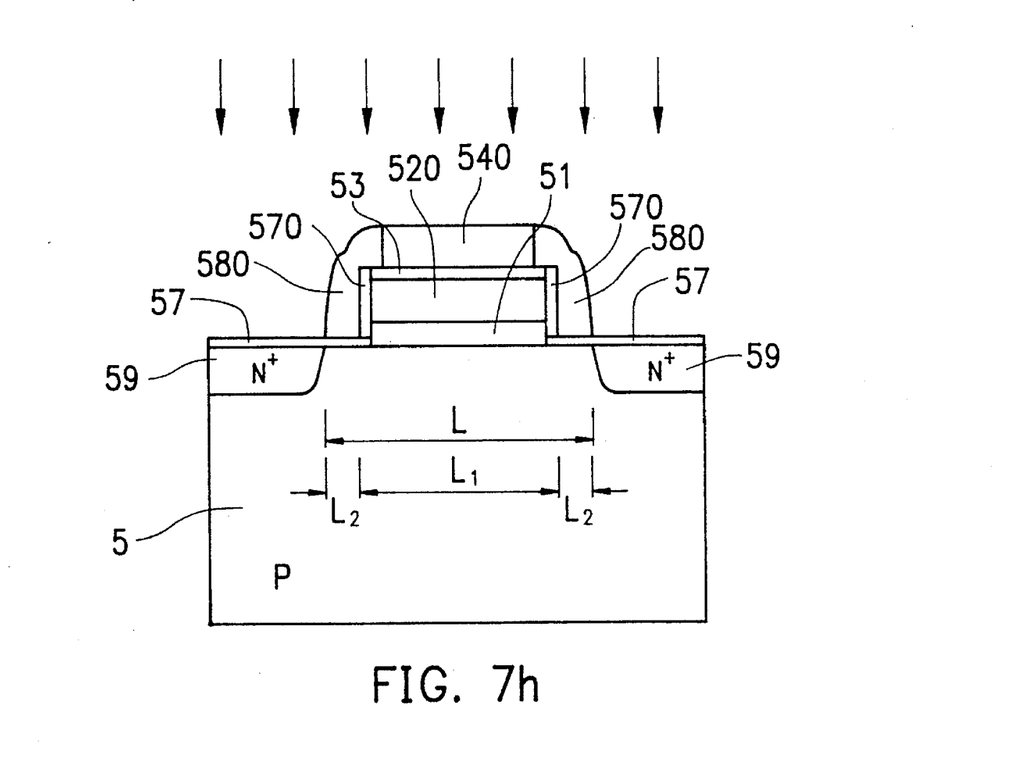

Referring next to FIG. 7h, an etching procedure employing, for example, plasma etching, is conducted to etch away all of conducting layer 58 except those portions forming sidewall spacers 580 covering conducting strips 540, as well as the sidewalls of isolating oxide layers 570 on both sides. Each of sidewall spacers 580, being a conductor itself also cover the area of tunnel oxide layer 57 near the generally vertical sidewall of isolating oxide layers 570, as well as the exposed edges of gate dielectric layer 53, while being isolated from control gate 520. Conducting strips 540 and sidewall spacers 580, being directly and electric-conductingly connected to each other, together constitute the floating gate of the memory cells of the flash memory device.

The combination of conducting strips 540 and sidewall spacers 580 are then utilized as the shielding mask for implementing an implantation process to form source and drain regions 59 in substrate 5. For example, the implantation can be conducted at an energy level of about 50KeV with an impurity concentration of about $2 \times 10^{15}$ atoms/cm$^2$. The impurity, N-type material such as As (arsenic), can be utilized for implantation to form $N^+$-type source and drain regions 59 as shown in the drawing.

The structural configuration of the memory cell for the split-gate flash memory devices as fabricated according to the process stages shown in FIGS. 7a–7h can enjoy the advantages of precise channel dimensioning due to the self-aligned fabrication process steps employed in the present invention. This split-gate flash memory device has a total channel length L, which includes one isolation transistor channel length $L_1$ and two floating-gate transistor channel lengths $L_2$. Both lengths $L_2$ and $L_2$ are not controlled by the photolithography method as is used in the prior art process. Instead, floating gate channel length $L_2$ can be well-controlled by the thickness of sidewall spacers 580. As mentioned above, this precisely-aligned channel dimensioning is important for the correct and reliable operation of the memory cell. If a device is fabricated in accordance with the present invention, erasure and writing operations of the memory cells can be implemented and separated from both sides of the cell unit. This capability improves the endurance of the memory device in terms of the number of information erasures and programming conducted during the lifetime of the device.

Although the present invention of the process for fabricating memory cells of flash memory devices has been described based on a specific embodiment featuring specific conditions, for example, dimensions of the preferred embodiment, it is, however, apparent to persons skilled in the art that the present invention is not limited thereto. Modifications to the exemplified material and process conditions can be made without departing from the scope of the disclosed invention, which is defined in the claims section that follows.

What is claimed is:

1. A process for fabricating memory cells for semiconductor flash memory devices comprising the steps of:

forming in sequence a gate oxide layer, a first conducting layer, and a gate dielectric layer on a semiconductor substrate;

forming a conducting strip on said gate dielectric layer, and covering said conducting strip with a shielding layer subsequently;

etching said gate dielectric layer, said first conducting layer and said gate oxide utilizing said shielding layer as a shielding mask to form a control gate for said memory cell;

implementing a thermal oxidation to an entire substrate utilizing said shielding layer as a thermal oxidation shielding mask to form a tunnel oxide layer on the surface of the substrate and forming isolating oxide layers on the sidewalls of said control gate;

removing said shielding layer;

forming electrically conducting sidewall spacers on both sidewalls of said conducting strip, each of said conducting sidewall spacers also covering a portion of said tunnel oxide layer, and is electrically isolated from said control gate by said isolating oxide layers, thereby forming a floating gate for the memory cell; and implementing an impurity implantation process utilizing said conducting strip and said conducting sidewall spacers as a floating gate shielding mask to both form source and drain regions on said substrate for said memory cell and to provide floating gate channel lengths in the semiconductor substrate.

2. The process for fabricating memory cells of claim 1, wherein said shielding layer include sidewall spacers.

3. The process for fabricating memory cells of claim 1, wherein said shielding layer is a nitride layer.

4. The process for fabricating memory cells of claim 1, wherein said first conducting layer, said conducting strip and said conducting sidewall spacers are polysilicon layers.

5. The process for fabricating memory cells of claim 1, where in said semiconductor substrate is a P-type substrate.

6. The process for fabricating memory cells of claim 1, wherein said semiconductor substrate is an N-type substrate.

7. A method for fabricating a memory cell for split-gate flash memory semiconductor devices comprising the steps of:

forming a gate oxide area on a semiconductor substrate of a first conductivity type;

forming a control gate layer symmetrically about said gate oxide area, a floating gate being formed by:
   a) forming on a gate dielectric layer a conducting strip having external sidewalls,
   b) locating said gate dielectric layer to electrically isolate said floating gate from said control gate layer, and
   c) locating electrically conducting sidewall spacers symmetrically about said conducting strip, said electrically conducting sidewall spacers contacting said external sidewalls, said electrically conducting sidewall spacers being electrically isolated form said control gate layer by an isolating oxide layer and said gate dielectric layer, said electrically conducting sidewall spacers being electrically isolated from said substrate by a tunnel oxide layer;

and forming source and drain regions of a second conductivity type in said substrate by implementing impurities in portions of said substrate outside an external parameter of said floating gate, utilizing the conducting strip and the conducting sidewall spacers as a floating gate shielding mask to both form the source and drain regions on said substrate for the memory cell and to provide floating gate channel lengths in the semiconductor substrate.

* * * * *